(12) United States Patent
Razeghi-Jahromi et al.

(10) Patent No.: US 12,111,821 B2
(45) Date of Patent: Oct. 8, 2024

(54) SYSTEMS AND METHODS FOR OPTIMAL SYNCHROPHASOR DATA RECOVERY

(71) Applicant: ABB Schweiz AG, Baden (CH)

(72) Inventors: Mohammad Razeghi-Jahromi, Cary, NC (US); David Lee Coats, Apex, NC (US); James D. Stoupis, Raleigh, NC (US)

(73) Assignee: ABB Schweiz AG, Baden (CH)

( * ) Notice: Subject to any disclaimer, the term of this patent is extended or adjusted under 35 U.S.C. 154(b) by 526 days.

(21) Appl. No.: 17/382,578

(22) Filed: Jul. 22, 2021

(65) Prior Publication Data

US 2023/0036843 A1    Feb. 2, 2023

(51) Int. Cl.
     *G06F 16/23*      (2019.01)
     *G01R 25/00*      (2006.01)

(52) U.S. Cl.
     CPC ......... *G06F 16/2379* (2019.01); *G01R 25/00* (2013.01)

(58) Field of Classification Search
None
See application file for complete search history.

(56) References Cited

U.S. PATENT DOCUMENTS

| 8,457,912 B1 | 6/2013 | Wells | |
|---|---|---|---|
| 2015/0121160 A1* | 4/2015 | Baone | G01D 3/028 |
| | | | 714/746 |
| 2019/0056436 A1* | 2/2019 | Nishikawa | G01R 19/2513 |
| 2019/0166026 A1* | 5/2019 | Konakalla | G05B 19/048 |
| 2019/0187294 A1 | 6/2019 | Khalajmehrabadi et al. | |

FOREIGN PATENT DOCUMENTS

EP      2866190 A1      4/2015

OTHER PUBLICATIONS

Zhiwei Yang, Hao Liu, Tianshu Bi, Zikang Li, Qixun Yang, An adaptive PMU missing data recovery method, International Journal of Electrical Power & Energy Systems, vol. 116, 2020, 105577, ISSN 0142-0615, https://doi.org/10.1016/j.ijepes.2019.105577 (Year: 2020).*

(Continued)

*Primary Examiner* — Lina Cordero
(74) *Attorney, Agent, or Firm* — Leydig, Voit & Mayer, Ltd.

(57) ABSTRACT

A method for recovering missing phase measurement unit (PMU) measurements from a plurality of PMUs is provided. The method comprises: receiving a plurality of obtained PMU measurements from the plurality of PMUs; populating a PMU dataset based on the plurality of obtained PMU measurements; determining a plurality of missing entries within the PMU dataset, wherein each of the plurality of missing entries indicates a missing PMU measurement within the PMU dataset at a particular time; determining a plurality of substitute entries for the plurality of missing entries based on an optimization algorithm that determines differences associated with a missing entry, of the plurality of missing entries, and a first set of PMU measurements, of the plurality of obtained PMU measurements, that are taken immediately prior to the missing entry; and inserting the plurality of substitute entries into the PMU dataset to generate a new PMU dataset.

18 Claims, 8 Drawing Sheets

(56) References Cited

OTHER PUBLICATIONS

Candès et al., "Exact Matrix Completion via Convex Optimization." *Foundations of Computational Mathematics*, 9(6): 717-772 (May 2008).

Candès et al., "The Power of Convex Relaxation: Near-Optimal Matrix Completion," *IEEE Transactions on Information Theory*, 56(5): 2053-2080 (May 2010).

Dahal et al., "Online Dimension Reduction of Synchrophasor Data," *IEEE*, PES T&D 2012 (May 2012).

Fazel et al., "Hankel Matrix Rank Minimization with Applications to System Identification and Realization," *SIAM Journal on Matrix Analysis and Applications*, 34(3): 946-977 (Jan. 2013).

Fazel, "Matrix Rank Minimization with Applications," Ph.D. Dissertation, Stanford Univ., 130 pp. (Mar. 2002).

Gao et al., "Modeless Reconstruction of Missing Synchrophasor Measurements," *Proc. of IEEE Power & Energy Society General Meeting*, Washington, D.C., 5 pp. (Jul. 2014).

Grant et al., "The CVX Users' Guide Release 2.2," 96 pp. (Jan. 28, 2020).

Jin et al., "Sparse and Low-Rank Decomposition of a Hankel Structured Matrix for Impulse Noise Removal," *IEEE Transactions on Image Processing*, Mar. 2018, pp. 1448-1461, vol. 27, No. 3.

Oymak et al., "Simultaneously Structured Models With Application to Sparse and Low-Rank Matrices," *IEEE Transactions on Information Theory*, 61(5): 2886-2908 (May 2015).

Patel et al., "Real-Time application of Synchrophasors for Improving Reliability to ensure the reliability of the bulk power system," *NERC North American Electric Reliability Corp.*, Princeton, NJ, 77 pp. (Oct. 18, 2010).

Peisert et al., "LBNL Open Power Data," *Berkeley Lab*, 4 pp. (Jan. 18, 2018).

Wang et al., "A Low-Rank Matrix Approach for the Analysis of Large Amounts of Power System Synchrophasor Data," *Proc. of Hawaii International Conf. on System Sciences*, IEEE, 8 pp. (Jan. 2015).

Wang et al., "Recent Results of PMU Data Analytics by Exploiting Low-dimensional Structures," *The 10th Bulk Power Systems Dynamics and Control Symposium—IREP* 2017, Espinho, Portugal, 6 pp. (Aug. 2017).

Wang et al., "A Low-rank Framework of PMU Data Recovery and Event Identification," 2019 *International Conference on Smart Grid Synchronized Measurements and Analytics* (SGSMA), IEEE, 9 pp. (2019).

Zhang et al., "Multichannel Hankel Matrix Completion Through Nonconvex Optimization," *IEEE J. of Selected Topics in Signal Processing*, 12(4):. 617-632 (Aug. 2018).

Zhang et al., "Multi-Channel Missing Data Recovery by Exploiting the Low-rank Hankel Structures," *IEEE International Workshop on Computational Advances in Multi-Sensor Adaptive Processing (CAMSAP)*, Curaçao, Dutch Antilles, 5 pp. (Dec. 2017).

Zhang et al., "Correction of Corrupted Columns Through Fast Robust Hankel Matrix Completion," *IEEE Transactions on Signal Processing*, 67(10): 2580-2594 (May 15, 2019).

Pourramezan et al., "Real-Time Processing and Quality Improvement of Synchrophasor Data," *IEEE Transactions on Smart Grid*, 11(4): 3313-3324 (Jul. 2020).

European Patent Office, Extended European Search Report in European Patent Application No. 22183852.7, 11 pp. (Jan. 2, 2023).

\* cited by examiner

| | 504 | 506 | 508 | 510 | 512 | 514 | 516 | 518 | 520 |
|---|---|---|---|---|---|---|---|---|---|
| 502 | | | | | | | | | |
| 522 | 331.0742 | 18.03707 | 217.4765 | 23.91613 | 83.31959 | 22.5073 | 358.0023 | 7469.843 | 238.2065 | 7471.928 |
| 524 | 331.1878 | 18.04292 | 217.6138 | 24.03471 | 83.42173 | 22.51231 | 358.0401 | 7469.822 | 238.245 | 7472.121 |
| 526 | 331.8021 | 18.11038 | 217.6602 | 24.06528 | 83.46639 | 22.55771 | 358.0797 | 7469.87 | 238.2845 | 7472.168 |
| 528 | 332.2708 | 18.14994 | 217.6804 | 24.04012 | 83.44759 | 22.54937 | 358.12 | 7470.055 | 238.3248 | 7472.142 |
| 530 | 332.0626 | 18.06337 | 217.6556 | 23.94303 | 83.41837 | 22.50016 | 358.1612 | 7470.196 | 238.3657 | 7472.101 |
| 532 | 331.9281 | 18.04875 | 217.5347 | 23.87921 | 83.52442 | 22.46214 | 358.2051 | 7470.246 | 238.409 | 7472.174 |
| 534 | 331.7934 | 18.06468 | 217.4965 | 23.87824 | 83.69821 | 22.38693 | 358.2494 | 7470.307 | 238.454 | 7472.337 |
| 536 | 331.5096 | 18.03473 | 217.5076 | 23.88718 | 83.64446 | 22.42081 | 358.292 | 7470.39 | 238.4985 | 7472.333 |
| 538 | 331.5121 | 18.05273 | 217.5858 | 23.91053 | 83.58801 | 22.51316 | 358.3354 | 7470.502 | 238.5426 | 7472.347 |
| 540 | 331.8519 | 18.08175 | 217.7745 | 23.97633 | 83.74548 | 22.47695 | 358.3802 | 7470.582 | 238.5865 | 7472.511 |

FIG. 5
500

| | 602 | 604 | 606 | 608 | 610 | 612 | 614 | 616 | 618 | 620 |
|---|---|---|---|---|---|---|---|---|---|---|
| 622 | 331.989 | 17.9606 | 217.555 | 23.61582 | 83.80306 | 22.27532 | 358.6254 | 7470.417 | 238.8302 | 7472.917 |
| 624 | 332.015 | 18.10714 | 217.8105 | 23.64067 | 84.04653 | 22.38574 | 358.6597 | 7470.207 | 238.8675 | 7472.715 |
| 626 | 331.986 | 18.08795 | 217.946 | | 84.24898 | 22.38089 | 358.6953 | 7470.003 | 238.9056 | 7472.5 |
| 628 | | | | | | | | | | |
| 630 | 332.123 | | 217.9405 | 23.83059 | 84.48718 | 22.38484 | 358.7667 | 7469.705 | 238.975 | 7472.042 |
| 632 | 332.447 | | 218.012 | 23.76218 | 84.27512 | 22.28799 | 358.8016 | 7469.653 | 239.0092 | 7471.771 |
| 634 | 332.403 | | 217.881 | 23.75994 | 84.03334 | 22.2756 | 358.8378 | 7469.589 | | 7471.634 |
| 636 | 332.275 | | 217.7897 | 23.82915 | 83.9537 | 22.26109 | 358.8746 | 7469.46 | | 7471.712 |
| 638 | 332.277 | 17.98999 | 217.7049 | 23.82529 | 84.14341 | 22.23784 | 358.9115 | 7469.5 | | 7471.903 |
| 640 | 332.387 | 17.99116 | 217.7405 | | 84.37937 | 22.27205 | 358.9494 | 7469.645 | 239.1569 | 7471.949 |

| | 602 | 604 | 606 | 608 | 610 | 612 | 614 | 616 | 618 | 620 |
|---|---|---|---|---|---|---|---|---|---|---|
| 622 | 331.989 | 17.9606 | 217.555 | 23.61582 | 83.80306 | 22.27532 | 358.6254 | 7470.417 | 238.8302 | 7472.917 |
| 624 | 332.015 | 18.10714 | 217.8105 | 23.64067 | 84.04653 | 22.38574 | 358.6597 | 7470.207 | 238.8675 | 7472.715 |
| 626 | 331.986 | 18.08795 | 217.946 | X8 | 84.24898 | 22.38089 | 358.6953 | 7470.003 | 238.9056 | 7472.5 |
| 628 | X1 | X2 | X7 | X9 | X11 | X12 | X13 | X14 | X15 | X19 |
| 630 | 332.123 | X3 | 217.9405 | X10 | 84.48718 | 22.38484 | 358.7667 | 7469.705 | 238.975 | 7472.042 |
| 632 | 332.447 | X4 | 218.012 | 23.83059 | 84.27512 | 22.28799 | 358.8016 | 7469.653 | 239.0092 | 7471.771 |
| 634 | 332.403 | X5 | 217.881 | 23.76218 | 84.03334 | 22.2756 | 358.8378 | 7469.589 | X16 | 7471.634 |
| 636 | 332.275 | X6 | 217.7897 | 23.75994 | 83.9537 | 22.26109 | 358.8746 | 7469.46 | X17 | 7471.712 |
| 638 | 332.277 | 17.98999 | 217.7049 | 23.82915 | 84.14341 | 22.23784 | 358.9115 | 7469.5 | X18 | 7471.903 |
| 640 | 332.387 | 17.99116 | 217.7405 | 23.82529 | 84.37937 | 22.27205 | 358.9494 | 7469.645 | 239.1569 | 7471.949 |

SYSTEMS AND METHODS FOR OPTIMAL SYNCHROPHASOR DATA RECOVERY

FEDERAL FUNDING

This invention was made with government support under Contract No. DE-AR0001024 awarded by the Department of Energy and the Advanced Research Projects Agency-Energy. The federal government may have certain rights in this invention.

FIELD

The present disclosure relates to recovering data from one or more phasor measurement units (PMUs).

BACKGROUND

The electric power industry is going through one of the greatest paradigm shifts since the discovery of electricity itself in the late 1800s. The massive modernization of the industry is fueled by state of the art information technologies, an exponential increase in computational power, and power system monitoring advances, such as synchrophasor technologies. A principle component of the smart grid initiative is the utilization of massive data sets to make future grids more efficient, reliable and environmentally friendly with minimal financial burden to the utilities and their stakeholders. For instance, PMUs may be spread across the power lines and provide measurements (e.g., magnitude and phase of the voltage and/or current measurements) at periodic time intervals (e.g., every five seconds or every minute) to a computing system.

Unfortunately, the computing system might not receive some of these measurements. For instance, due to network connectivity issues and/or other reasons, PMUs might not be able to take certain measurements (e.g., the PMUs may lose power temporary and therefore cannot take measurements during their power loss) and/or the computing system might not receive these measurements even if they are taken (e.g., due to network connectivity issues, the measurements might be lost during transmission to the computing system). Certain methodologies such as by using Nuclear Norm Minimization or Hankel Norm Minimization may be used to recover some of these lost measurements. However, while Nuclear Norm may be able to determine randomized missing data, it is unable to determine temporally missing data. Randomized missing data may include data losses that occur randomly and independently across time and channels. Temporally missing data may include data that is lost at randomly selected time instants and the data points in all channels may be lost simultaneously. Hankel norm minimization may also be used, but due to the amount of data received each minute, Hankel norm optimization requires too much computational and processing resources to effectively determine the missing measurements. Accordingly, there remains a technical need for determining the missing PMU measurements so as to accurately determine the current state of the power grid.

SUMMARY

A first aspect of the present disclosure provides a method for recovering missing phase measurement unit (PMU) measurements from a plurality of PMUs. The method comprises: receiving a plurality of obtained PMU measurements from the plurality of PMUs, wherein each of the plurality of obtained PMU measurements is associated with a time stamp and a sensor reading corresponding to an electrical characteristic; populating a PMU dataset based on the plurality of obtained PMU measurements; determining a plurality of missing entries within the PMU dataset, wherein each of the plurality of missing entries indicates a missing PMU measurement within the PMU dataset at a particular time; determining a plurality of substitute entries for the plurality of missing entries based on an optimization algorithm that determines differences associated with a missing entry, of the plurality of missing entries, and a first set of PMU measurements, of the plurality of obtained PMU measurements, that are taken immediately prior to the missing entry; inserting the plurality of substitute entries into the PMU dataset to generate a new PMU dataset; and executing an action based on the new PMU dataset.

According to an implementation of the first aspect, each of the plurality of PMUs is located at a different location within a power system and configured to obtain a plurality of sensor readings corresponding to a plurality of electrical characteristics at the location and the plurality of electrical characteristics comprise a magnitude of a current, a phase angle of the current, a magnitude of a voltage, and a phase angle of the voltage.

According to an implementation of the first aspect, determining the first set of PMU measurements based on an electrical characteristic, of the plurality of electrical characteristics, associated with a first missing entry, the first set of PMU measurements are PMU measurements that are taken by a first PMU, of the plurality of PMUs, immediately prior in time to the first missing entry.

According to an implementation of the first aspect, the plurality of missing entries comprises a plurality of sequentially missing entries for the electrical characteristic, wherein the plurality of sequentially missing entries comprises the first missing entry within the plurality of sequentially missing entries and a last missing entry within the plurality of sequentially missing entries. The method further comprises: determining a second set of PMU measurements, of the plurality of obtained PMU measurements, that are taken immediately after the last missing entry, and wherein determining the plurality of substitute entries is further based on the second set of PMU measurements.

According to an implementation of the first aspect, the plurality of missing entries further comprises a second missing entry associated with a second electrical characteristic, of the plurality of electrical characteristics, that is different from the electrical characteristic associated with the first missing entry. The method further comprises: determining a third set of PMU measurements based on the second electrical characteristic, wherein the third set of PMU measurements are PMU measurements that are taken by a second PMU, of the plurality of PMUs, immediately prior in time to the second missing entry. The determining the plurality of substitute entries is further based on the third set of PMU measurements.

According to an implementation of the first aspect, the PMU dataset is a matrix indicating the plurality of obtained PMU measurements and the plurality of missing entries. The determining entries comprises: using a column stacking vector and a total variation (TV) algorithm to determine a TV norm definition associated with the plurality of obtained PMU measurements and the plurality of missing entries.

According to an implementation of the first aspect, the TV algorithm is a first order equation that is a summation of the differences between each entry within the PMU dataset with a previous entry within the PMU dataset.

According to an implementation of the first aspect, the TV algorithm is a second order equation.

According to an implementation of the first aspect, determining the plurality of substitute entries further comprises using a nuclear norm minimization algorithm and a TV parameter that is a weighted value for the TV algorithm to distinguish the TV algorithm from the nuclear norm minimization algorithm.

According to an implementation of the first aspect, the method further comprising: using a plurality of historical PMU measurements from the plurality of PMUs within the power system to determine a plurality of TV parameters; and determining the TV parameter from the plurality of TV parameters based on a relative recovery error associated with the plurality of historical PMU measurements.

According to an implementation of the first aspect, the plurality of missing entries indicates temporally missing data and randomized missing data and determining the plurality of substitute entries comprises using the optimization algorithm to determine the plurality of substitute entries for the temporally missing data and the randomized missing data.

A second aspect of the present disclosure provides a system for recovering missing phase measurement unit (PMU) measurements. The system comprises a plurality of PMUs configured to obtain a plurality of PMU measurements; and a hierarchical computing system. The hierarchical computer system comprises one or more first computing systems configured to: receive the plurality of obtained PMU measurements from the plurality of PMUs, wherein each of the plurality of obtained PMU measurements is associated with a time stamp and a sensor reading corresponding to an electrical characteristic; and provide the plurality of obtained PMU measurements to one or more second computing systems; and the one or more second computing systems configured to: populate a PMU dataset based on the plurality of obtained PMU measurements; determine a plurality of missing entries within the PMU dataset, wherein each of the plurality of missing entries indicates a missing PMU measurement within the PMU dataset at a particular time; determine a plurality of substitute entries for the plurality of missing entries based on an optimization algorithm that determines differences associated with a missing entry, of the plurality of missing entries, and a first set of PMU measurements, of the plurality of obtained PMU measurements, that are taken immediately prior to the missing entry; insert the plurality of substitute entries into the PMU dataset to generate a new PMU dataset; and execute an action based on the new PMU dataset.

According to an implementation of the second aspect, each of the plurality of PMUs is located at a different location within a power system, and wherein the plurality of PMUs are configured to obtain the plurality of PMU measurements by obtaining a plurality of sensor readings corresponding to a plurality of electrical characteristics at the location, and wherein the plurality of electrical characteristics comprise a magnitude of a current, a phase angle of the current, a magnitude of a voltage, and a phase angle of the voltage.

According to an implementation of the second aspect, the one or more second computing systems are further configured to: determine the first set of PMU measurements based on an electrical characteristic, of the plurality of electrical characteristics, associated with a first missing entry, wherein the first set of PMU measurements are PMU measurements that are taken by a first PMU, of the plurality of PMUs, immediately prior in time to the first missing entry.

According to an implementation of the second aspect, the plurality of missing entries comprises a plurality of sequentially missing entries for the electrical characteristic, wherein the plurality of sequentially missing entries comprises the first missing entry within the plurality of sequentially missing entries and a last missing entry within the plurality of sequentially missing entries, and the one or more second computing systems are further configured to: determine a second set of PMU measurements, of the plurality of obtained PMU measurements, that are taken immediately after the last missing entry, and wherein determining the plurality of substitute entries is further based on the second set of PMU measurements.

According to an implementation of the second aspect, the plurality of missing entries further comprises a second missing entry associated with a second electrical characteristic, of the plurality of electrical characteristics, that is different from the electrical characteristic associated with the first missing entry, and the one or more second computing systems are further configured to: determine a third set of PMU measurements based on the second electrical characteristic, wherein the third set of PMU measurements are PMU measurements that are taken by a second PMU, of the plurality of PMUs, immediately prior in time to the second missing entry, and wherein determining the plurality of substitute entries is further based on the third set of PMU measurements.

According to an implementation of the second aspect, the PMU dataset is a matrix indicating the plurality of obtained PMU measurements and the plurality of missing entries, and wherein the one or more second computing systems are configured to determine the plurality of substitute entries by using a column stacking vector and a total variation (TV) algorithm to determine a TV norm definition associated with the plurality of obtained PMU measurements and the plurality of missing entries.

According to an implementation of the second aspect, the TV algorithm is a first order equation that is a summation of the differences between each entry within the PMU dataset with a previous entry within the PMU dataset.

According to an implementation of the second aspect, determining the plurality of substitute entries further comprises using a nuclear norm minimization algorithm and a TV parameter that is a weighted value for the TV algorithm to distinguish the TV algorithm from the nuclear norm minimization algorithm.

A third aspect of the present disclosure provides a non-transitory computer-readable medium having processor-executable instructions stored thereon. The processor-executable instructions, when executed by one or more controllers, facilitate: receiving a plurality of obtained PMU measurements from a plurality of PMUs, wherein each of the plurality of obtained PMU measurements is associated with a time stamp and a sensor reading corresponding to an electrical characteristic; populating a PMU dataset based on the plurality of obtained PMU measurements; determining a plurality of missing entries within the PMU dataset, wherein each of the plurality of missing entries indicates a missing PMU measurement within the PMU dataset at a particular time; determining a plurality of substitute entries for the plurality of missing entries based on an optimization algorithm that determines differences associated with a missing entry, of the plurality of missing entries, and a first set of PMU measurements, of the plurality of obtained PMU measurements, that are taken immediately prior to the missing entry; inserting the plurality of substitute entries into the PMU dataset to generate a new PMU dataset; and executing an action based on the new PMU dataset.

BRIEF DESCRIPTION OF THE DRAWINGS

Embodiments of the present disclosure will be described in even greater detail below based on the exemplary figures. The present disclosure is not limited to the exemplary embodiments. All features described and/or illustrated herein can be used alone or combined in different combinations in embodiments of the present disclosure. The features and advantages of various embodiments of the present disclosure will become apparent by reading the following detailed description with reference to the attached drawings which illustrate the following:

FIG. 5 depicts an exemplary PMU dataset of sensor measurements according to one or more examples the present disclosure;

FIG. 6 depicts another exemplary PMU dataset of sensor measurements according to one or more examples of the present disclosure;

FIG. 7 depicts another exemplary PMU dataset of sensor measurements according to one or more examples of the present disclosure.

DETAILED DESCRIPTION

Figure 1:
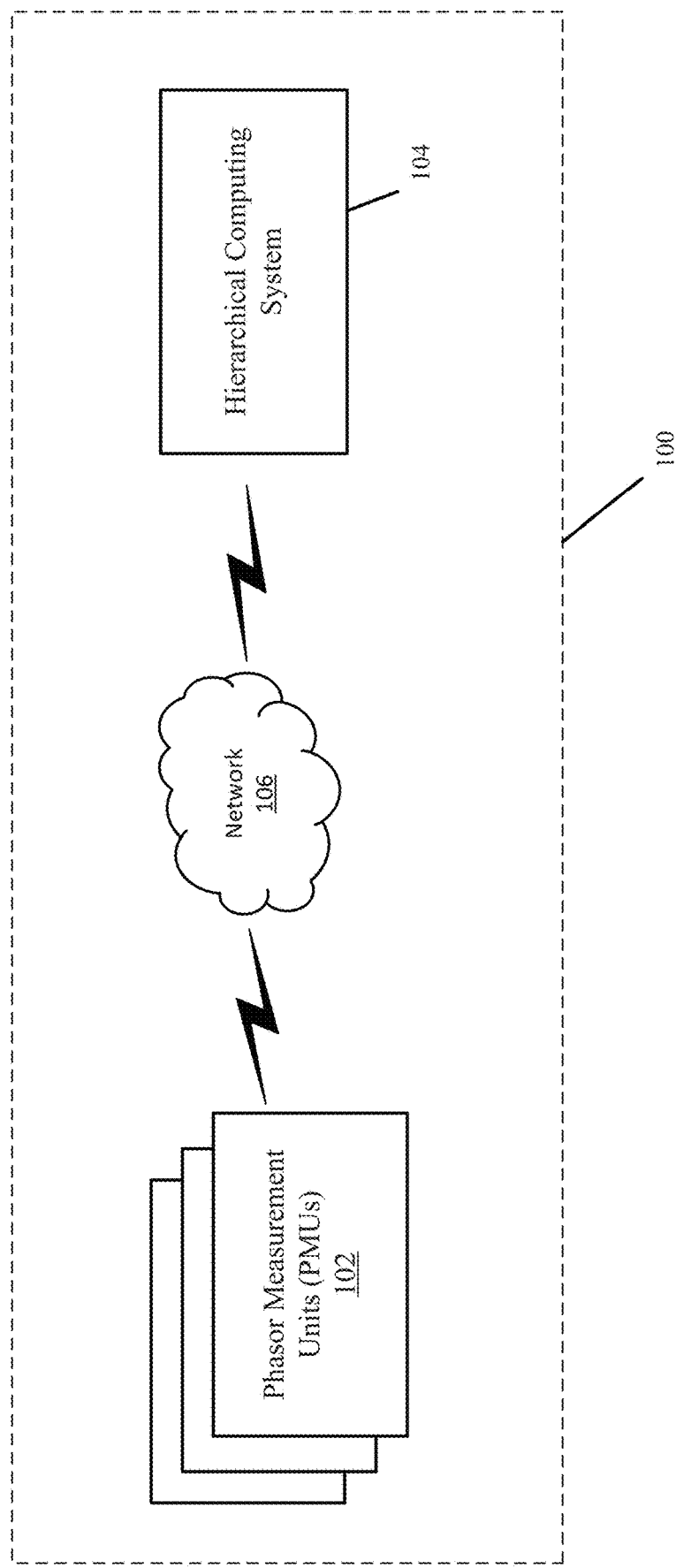
FIG. 1 illustrates a simplified block diagram depicting an exemplary environment for recovering sensor measurements from PMUs according to one or more examples of the present disclosure.

The present disclosure describes a system and method for optimal synchrophasor data recovery. For example, a plurality of phasor measurement units (PMUs) may be spread across a power system (e.g., an electrical/power grid) and may provide sensor measurements (e.g., voltage, current, frequency, and so on) to a computing system at a periodic time interval. Unfortunately, due to a variety of factors, the computing system might not receive some of these sensor measurements, which may cause problems for the power system. For instance, without these measurements, it may be difficult for the computing system to determine an accurate present operating state of the power system. Therefore, the power system may generate and/or provide too much or too little power to certain destinations, which in the extreme, may cause power outages and/or other detrimental effects. As such, the present disclosure describes a system and method for determining an accurate estimation of these missing sensor measurements for use in determining the present operating state of the power system and/or other applications.

Traditional methods such as Nuclear Norm Minimization or Hankel Norm Minimization have been used previously, but suffer from certain drawbacks. For instance, mathematically speaking, an n×n matrix with rank r<<n has r*(2n−r) degrees of freedom (e.g., it may be described by O(r*n) parameters with O indicating the order of complexity within the algorithm, and may be recovered using O(r*n) generic measurements in both convex and nonconvex recovery algorithms). Therefore, the order of complexity of recovering a low-rank matrix is equal to its degrees of freedom. On the other hand, the degrees of freedom ratio of the Hankel matrix to the data matrix as a linear function of integer $n_1 \in [r, n+1-r]$ considering r<<min ($n_c$,n) may be calculated as:

$$Df_{Ratio(n_1)} = \frac{Df(H_{n_1}(X))}{Df(X)} \approx \frac{n_c n_1 + n}{n_c + n} \approx n_1 \gg 1.$$

As a result, solving the Hankel minimization problem may be more computationally costly compare to the nuclear norm minimization problem due to the difference in their degrees of freedom. Further, as mentioned above, the nuclear norm minimization problem is unable to determine temporally missing data. As such, the present disclosure is advantageous as it is low ranked unlike the Hankel minimization problem, which leads to less computationally intensive calculations and reduced memory usage. Further, the present disclosure is advantageous as it is able to determine both temporally missing data and randomly missing data, which is unlike the nuclear norm minimization.

In particular, exemplary aspects according to the present disclosure, are further elucidated below in connection with exemplary embodiments, as depicted in the figures. The exemplary embodiments illustrate some implementations of the present disclosure and are not intended to limit the scope of the present disclosure. Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

Where possible, any terms expressed in the singular form herein are meant to also include the plural form and vice versa, unless explicitly stated otherwise. Also, as used herein, the term "a" and/or "an" shall mean "one or more" even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on".

FIG. 1 illustrates a simplified block diagram depicting an exemplary environment 100 for recovering sensor measurements from PMUs according to one or more examples of the present disclosure. Referring to FIG. 1, the environment 100 may be a power system and may include one or more PMUS 102, a hierarchical computing system 104 (e.g., an edge computing device), and a network 106. Although the entities within environment 100 may be described below and/or depicted in the FIGS. as being singular entities, it will be appreciated that the entities and functionalities discussed herein may be implemented by and/or include one or more entities.

The entities within the environment 100 such as the PMUs 102 and the hierarchical computing system 104 may be in communication with other systems within the environment 100 via the network 106. The network 106 may be a global area network (GAN) such as the Internet, a wide area network (WAN), a local area network (LAN), or any other type of network or combination of networks. The network 106 may provide a wireline, wireless, or a combination of wireline and wireless communication between the entities within the environment 100. For example, the PMUs 102 may be connected to the hierarchical computing system 104 via a wired connection such that the PMUs 102 may provide sensor measurements to the hierarchical computing system 104. Additionally, and/or alternatively, the PMUs 102 may include a network communications interface that is capable of transmitting information to the hierarchical computing system 104 using wireless communications (e.g., via one or more communication protocols such as WI-FI, BLUETOOTH, and so on).

The hierarchical computing system 104 is a computing system that includes one or more computing devices, computing platforms, systems, servers, and/or other apparatuses capable of performing tasks, functions, and/or other actions for the environment 100. In particular, the hierarchical computing system 104 may communicate with the PMUs 102 and/or additional computing devices. For example, the hierarchical computing system 104 may obtain PMU measurements from a plurality of PMUs 102. Then, the hierarchical computing system 104 may generate a PMU dataset (e.g., one or more matrices that include the PMU measurements), determine missing entries (e.g., missing PMU measurements) within the PMU dataset, determine substitute entries (e.g., substitute or estimated PMU values) for the missing entries based on PMU measurements taken immediately prior and/or immediately subsequent to the missing entries, and insert the substitute entries into the PMU dataset. This will be described in further detail below.

The PMUs 102 are devices that are used to obtain, measure, determine, and/or provide measurements associated with a power system and/or an electric grid. For example, the PMUs 102 may measure electrical characteristics (e.g., voltage, current, power) including the magnitude and phase angles of an electrical phasor quantity within the power system/electric grid. The electrical characteristics that may be obtained by the PMUs 102 include, but are not limited to, one or more sequence current magnitudes, one or more sequence current phase angles, one or more phase current magnitudes, one or more phase current angles, one or more sequence voltage magnitudes, one or more sequence voltage phase angles, one or more phase voltage magnitudes, one or more phase voltage phase angles, one or more ground current magnitudes, one or more current phase angles, one or more frequencies, and/or one or more frequency deltas.

The PMUs 102 may provide information indicating the electrical characteristics to the hierarchical computing system 104. This may be done at certain time intervals (e.g., certain sampling rates such as 30, 50, or 60 samples per second). For instance, in a simplified example, each PMU 102 may measure the electrical characteristics every second and then provide these electrical characteristics to the hierarchical computing system 104. The hierarchical computing system 104 may receive these measurements from all of the PMUs 102. The size of this data may be massive. For example, this may be in the range of several terabits per day; however, a current system may handle 120 online PMUs with 3.6 billion measurements archived per day with only a storage size of 36 gigabits (GB). Accordingly, due to the storage space as well as the amount of collected data per day, there needs to be an efficient system to determine the missing PMU measurements in a timely manner, which is not capable using the Hankel method.

In some variations, the hierarchical computing system 104 may be implemented using one or more computing platforms, devices, servers, and/or apparatuses. In other variations, the hierarchical computing system 104 may be implemented as engines, software functions, and/or applications. In other words, the functionalities of the hierarchical computing system 104 may be implemented as software instructions stored in storage (e.g., memory) and executed by one or more processors.

It will be appreciated that the exemplary environment depicted in FIG. 1 is merely an example, and that the principles discussed herein may also be applicable to other environments.

Figure 2:
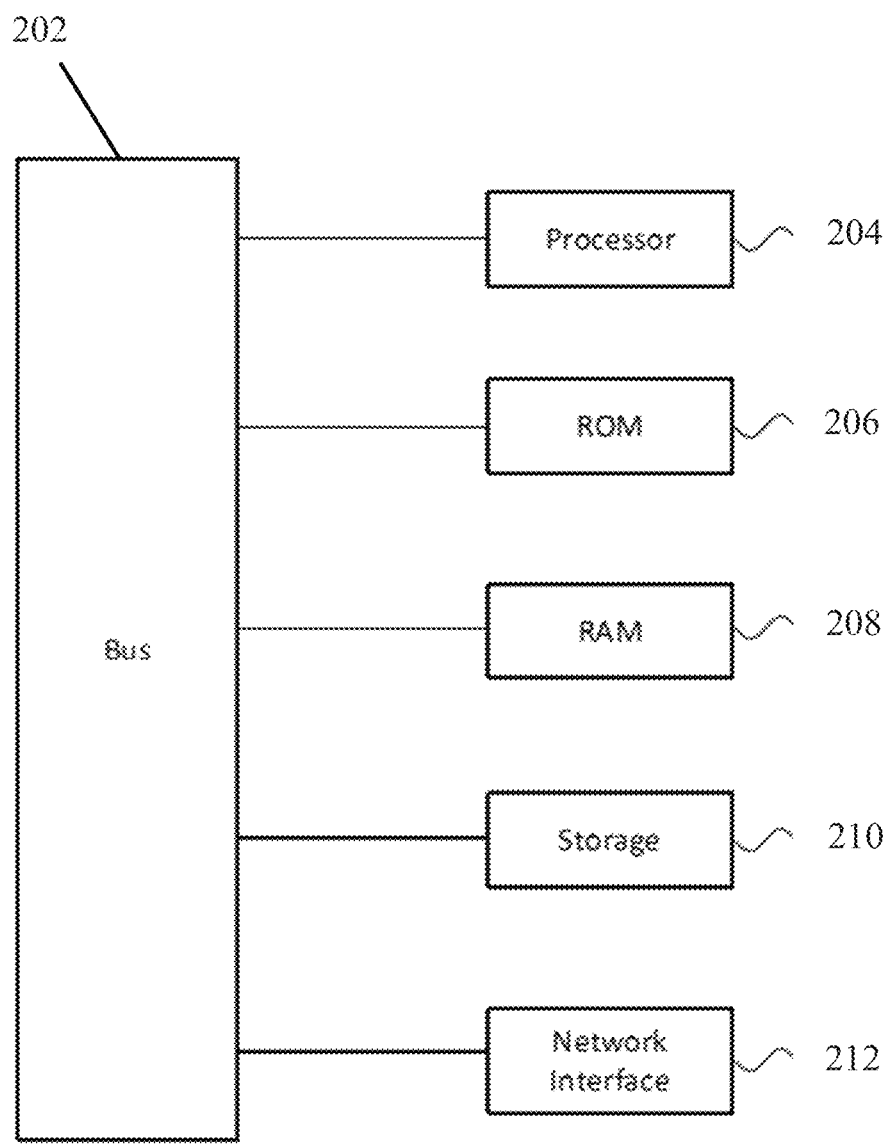
FIG. 2 illustrates a simplified block diagram of one or more devices or systems within the exemplary environment of FIG. 1.

FIG. 2 is a block diagram of an exemplary system and/or device 200 (e.g., edge device in the hierarchical computing system 104) within the environment 100. The device/system 200 includes a processor 204, such as a central processing unit (CPU), controller, and/or logic, that executes computer executable instructions for performing the functions, processes, and/or methods described herein. In some examples, the computer executable instructions are locally stored and accessed from a non-transitory computer readable medium, such as storage 210, which may be a hard drive or flash drive. Read Only Memory (ROM) 206 includes computer executable instructions for initializing the processor 204, while the random-access memory (RAM) 208 is the main memory for loading and processing instructions executed by the processor 204. The network interface 212 may connect to a wired network or cellular network and to a local area network or wide area network, such as the network 106. The device/system 200 may also include a bus 202 that connects the processor 204, ROM 206, RAM 208, storage 210, and/or the network interface 212. The components within the device/system 200 may use the bus 202 to communicate with each other. The components within the device/system 200 are merely exemplary and might not be inclusive of every component, server, device, computing platform, and/or computing apparatus within the device/system 200.

Figure 3:
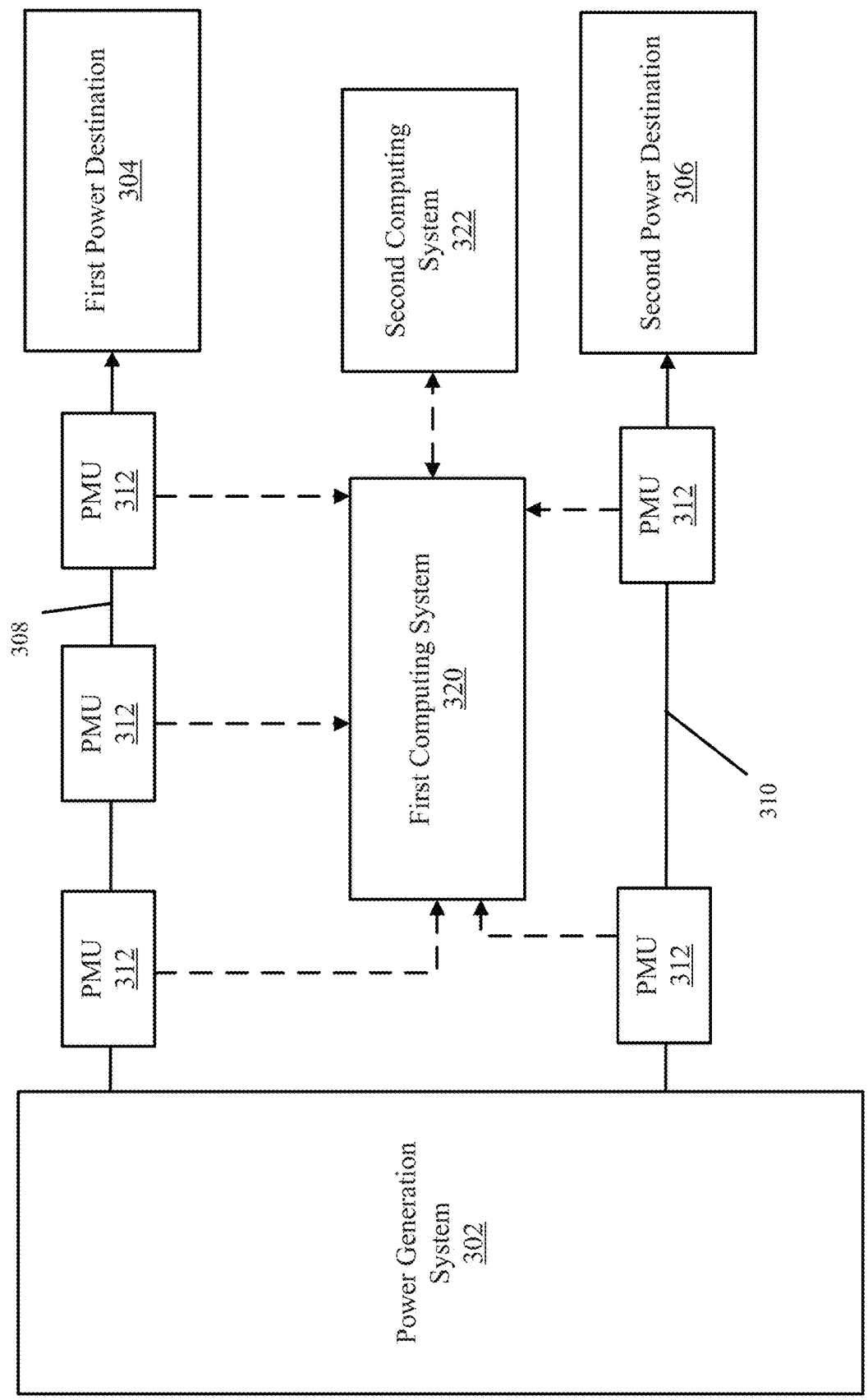
FIG. 3 illustrates a simplified block diagram depicting another exemplary environment for recovering sensor measurements from PMUs according to one or more examples of the present disclosure.

FIG. 3 illustrates a simplified block diagram depicting another exemplary environment 300 for recovering sensor measurements from PMUs 102 according to one or more examples of the present disclosure. The environment 300 may be an exemplary power grid or power system. The environment 300 may be similar to environment 100, but also shows a power generation system 302 as well as a first and second power destination 304 and 306. The hierarchical computing system 104 of environment 100 may include the first computing system 320 and the second computing system 322. For instance, the first computing system 320 may obtain the PMU measurements from the PMUs 312 directly and provide the PMU measurements or a subset of gathered or processed PMU data to the second computing system 322. The environment 300 may further include PMUs 312 which are in electrical communication (e.g., denoted by the dotted lines) with the hierarchical computing system 104.

Further, the environment 300 also includes a power generation system 302. The power generation system 302 is any system that is capable of generating power. For example, the power generation system 302 may be a power plant or another power provider. The power generation system 302 may provide the generated power to a plurality of destinations such as a first power destination 304 and a second power destination 306. For example, the first and second power destinations 304 and 306 may be regional distribution centers for providing the generated power or direct consumers such as factories or manufacturing plants. The lines 308 and 310 may be power lines that are used to provide the generated power from the power generation system 302 to the first and second power destinations 304 and 306. The PMUs 312 may be spread across these power lines 308 and 310 and may measure sensor measurements (e.g., magnitude/phase angle of the voltage/current) at the locations on the power lines 308 and 310.

The hierarchical computing system 104 may include one or more first computing systems 320 and one or more second computing systems 322. The first computing system 320 may be and/or include an edge computing device (e.g., a compact or low-power ruggedized computing device often collocated with distribution hardware such as re-closers or line sensors), a rugged computing unit embedded within power components/collocated within their control cabinets or shelfs, or a substation computer/server. The second computing system 322 may be and/or include a substation computer/server, or servers at the utility control center or in a public or on-premise cloud.

For example, in operation the first computing system 320 may be a computing element located within a distribution control cabinet communicating wired or wirelessly to collocated digital sample gathering units and/or PMU devices. The first computing system 320 may provide initial preprocessing, data formatting, or operation of the data recovery algorithms. Updates from the processing performed on the first computing system 320 may be communicated to a substation computer/server acting as the second computing system 322 over either a wired or wireless protocol. This computer/server system 322 may perform aggregation of one or multiple first computing system(s) 320 and the data recovery algorithm on the digital sampled data. In some instances, the second computing system 322 may be implemented as a container or virtual machine running on physical computer, server, or cloud bare metal hardware.

It will be appreciated that the exemplary environment depicted in FIG. 3 is merely an example, and that the principles discussed herein may also be applicable to other environments. In particular, power systems and power grids may include significantly more power generation systems, power lines, destinations, and/or PMUs. Accordingly, numerous PMUs (e.g., hundreds, thousands, or even greater in number PMUs) may be in communication with the hierarchical computing system 104 and provide the measured sensor measurements to the hierarchical computing system 104. Further, in some variations, the hierarchical computing system 104 may include numerous (e.g., three or more) computing systems and each computing system may pass information up the chain to the next computing system. For instance, the first computing system 320 may receive the PMU measurements directly from the PMUs 312 and may provide the PMU measurements to the second computing system 322. Then, the second computing system 322 may perform one or more functionalities and/or provide the PMU measurements and/or other data to a third computing system. The third computing system may perform one or more functionalities and/or provide the PMU measurements and/or other data to a fourth computing system, and so on. Any one of the computing systems (e.g., the first computing system, the second computing system, the third computing system, the fourth computing system, and so on) may perform process 400, which is described below, to recover the sensor measurements from the PMUs.

Figure 4:
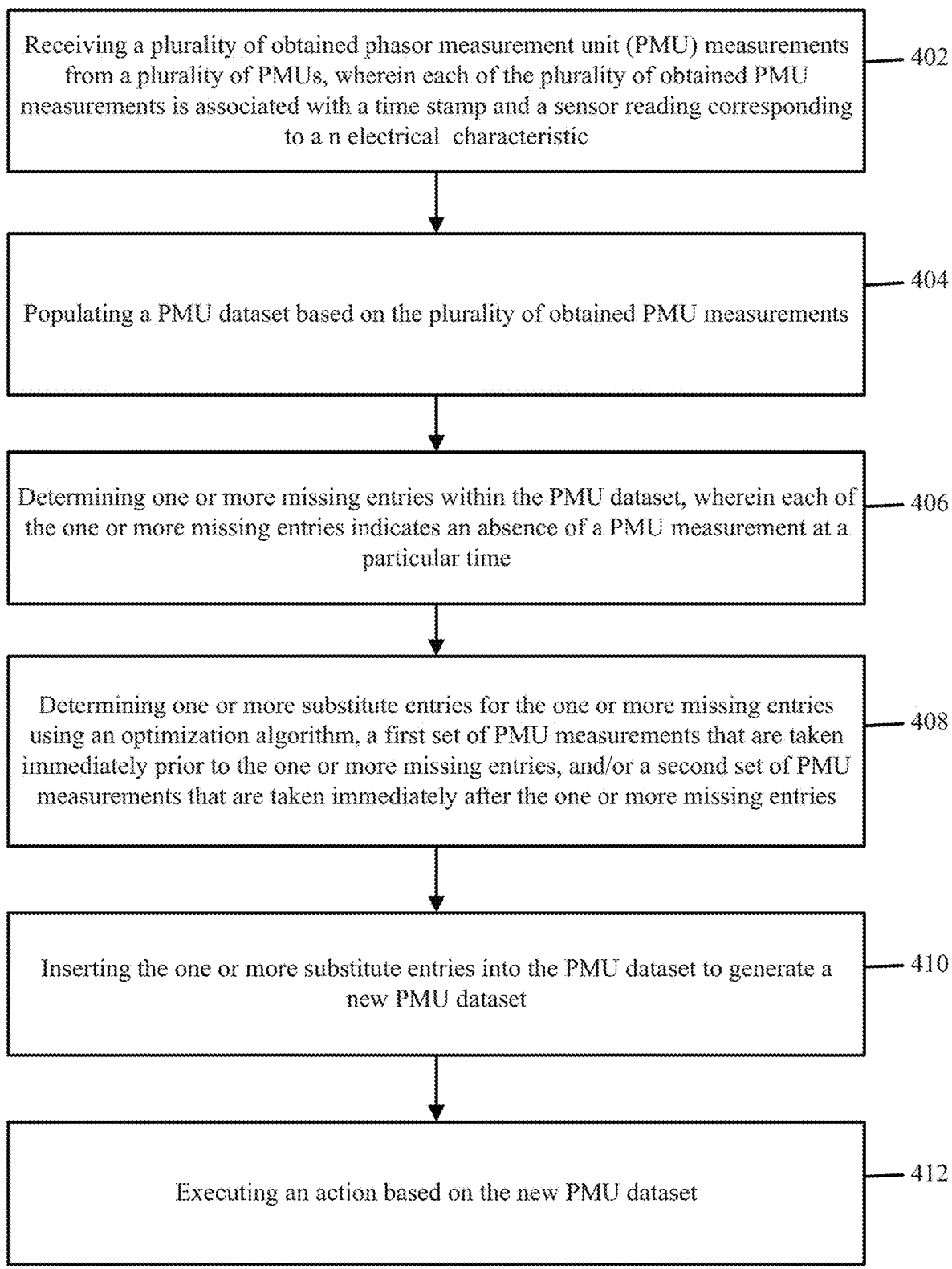
FIG. 4 illustrates a process for recovering sensor measurements from PMUs according to one or more examples of the present disclosure.

FIG. 4 illustrates a process 400 for recovering sensor measurements from PMUs according to one or more examples of the present disclosure. The process 400 may be performed by the hierarchical computing system 104 that is shown in FIGS. 1 and 3. However, it will be recognized that any of the following blocks may be performed in any suitable order and that the process 400 may be performed in any suitable environment and by any suitable device and/or system.

At block 402, the hierarchical computing system 104 receives a plurality of phasor measurement unit (PMU) measurements from a plurality of PMUs (e.g., PMUs 102 and/or 312). Each of the plurality of PMU measurements is associated with a time stamp and a sensor reading corresponding to an electrical characteristic. For example, the PMUs may be spread across a power system/power grid and may obtain measurements (e.g., electrical characteristic measurements such as magnitude and phase angles of the current and voltage) at their location. The PMUs may obtain these measurements at a certain sampling rate and/or a periodic time interval (e.g., every second or thirty times per second). After obtaining these measurements, the PMUs may provide and the hierarchical computing system 104 may receive these measurements. For each of these measurements that are received by the hierarchical computing system 104, the measurements may include a time stamp such as a certain time of the day (e.g., 10:00 AM) that the measurement was taken by the PMU as well as a sensor reading such as a magnitude or phase angle of the current (e.g., 1 Amp (A)) and/or voltage (e.g., 5 Volts (V)). Each PMU may obtain a plurality of sensors measurements at the time stamp and provide these measurements as well as the time stamp to the hierarchical computing system 104.

At block 404, the hierarchical computing system 104 populates a PMU dataset based on the plurality of PMU measurements. For example, the PMU dataset may be and/or include one or more matrices and the hierarchical computing system 104 may populate the PMU dataset using the received PMU measurements. For instance, the PMU dataset may include a plurality of entries (e.g., denoting the entries/values within the matrix) and each of the entries is associated with a PMU measurement. FIG. 5 shows an exemplary PMU dataset and will be used to describe block 404 and process 400 in more detail.

In particular, FIG. 5 depicts an exemplary PMU dataset 500 of PMU sensor measurements according to one or more examples the present disclosure. The PMU dataset 500 may include multiple PMU measurements from multiple different PMUs (e.g., PMUs 102 and/or 312). For instance, each PMU may provide one or more PMU measurements. For example, in some instances a first PMU may provide the PMU measurements shown in columns 502-512, a second PMU may provide the PMU measurements shown in columns 514 and 516, and a third PMU may provide the PMU measurements shown in columns 518-520. In other words, the first PMU may provide a first current angle (e.g., column 502), a first current magnitude (e.g., column 504) associated with the first current angle, a second current angle (e.g., column 506), a second current magnitude (e.g., column 508) associated with the second current angle, a third current angle (e.g., column 510), and a third current magnitude (e.g., column 512) associated with the third current angle. The second PMU may provide a first voltage angle (e.g., column 514) and a first voltage magnitude (e.g., column 516) associated with the first voltage angle. The third PMU may provide a second voltage angle (e.g., column 518) and a second voltage magnitude (e.g., column 520) associated with second voltage angle. The rows 522-540 correspond to a sampling rate for the PMU measurements and denote a particular time associated with the PMU measurement. For instance, row 522 may indicate a first time (e.g., 10:00:00 AM) that the PMUs made these particular measurements, row 524 may indicate a second time that is a second later (e.g., 10:00:01 AM) that the PMUs made these particular measurements, and so on. For example, the first PMU may have provided two PMU measurements (e.g., 331.0742 and 18.03707) to the hierarchical computing system 104 with the 10:00:00 AM time stamp.

The PMUs may continuously obtain and provide PMU measurements along with their time stamps to the hierarchical computing system 104. After receiving these PMU measurements, the hierarchical computing system 104 may continuously update and/or populate the PMU dataset (e.g., the PMU dataset 500) with this data. It will be appreciated that the exemplary PMU dataset 500 depicted in FIG. 5 is merely an example, and that the hierarchical computing system 104 may continuously obtain PMU measurements from numerous PMUs (e.g., hundreds, thousands, and so on). As such, the PMU dataset may include substantially more entries within the matrix (e.g., tens, hundreds, thousands of columns, or even greater number of columns) representing the PMU measurements taken from the PMUs. Further, the sampling rate for the PMUs may be 1 sample a minute, 1 sample per second, 30 samples per second, 60 samples per second, or a different sampling rate. Therefore, the number of rows within the PMU dataset may greater (even substantially greater) than as shown in the PMU dataset 500.

As shown in FIG. 5, each entry (e.g., each PMU measurement with an associated time stamp) may be filled in. In other words, the hierarchical computing system 104 may have received the sensor measurements at each of the time stamps from the PMUs. However, in some instances, this might not always be the case. For instance, due to connectivity issues, the hierarchical computing system 104 might not receive certain and/or entire sets of measurements from a single PMU and/or multiple PMUs. Due to noise, environmental circumstances, and/or other factors, the hierarchical computing system 104 might receive one or more PMU measurements, but might not receive other PMU measurements. Additionally, and/or alternatively, some PMUs may be incapable or unable to obtain a particular measurement or multiple measurements at certain time periods. For instance, a PMU 312 may have a temporary loss of power, which results in the PMU 312 not obtaining one or more missing measurements. Other factors that may cause the hierarchical computing system 104 to not receive one or more PMU measurements from the PMUs include, but are not limited to, communication congestion and/or data corruption by noise, which may make the received data useless.

The hierarchical computing system 104 may perform one or more functionalities using the PMU dataset and/or provide the PMU dataset to another system to perform the one or more functionalities. For instance, the hierarchical computing system 104 may use the PMU dataset for state estimation (e.g., identify the present operating state of a particular power system and/or power grid such as the power system 300). However, if the PMU dataset is missing some entries, it may be difficult to perform state estimation as the current circumstances might not be known. For instance, if there is a weather event occurring, the current state of the power system 300 may be beneficial to have for the power generation system 302. In other words, the power generation system 302 may be provided with the current state estimation of the system and using the current state estimation, the power generation system 302 may provide additional or reduce the power for the power system 300. Additional, and/or alternative uses for the complete PMU dataset include, but are not limited to anomaly detection (e.g., if data is missing from the PMU dataset and is able to be recorded, then a system may compare it with the real data to figure out if there is an anomaly within the data), perform data analytics (e.g., use the PMU dataset for machine learning/artificial intelligence or other steps of running a particular frequency analysis), cleaning up the data, false data injection, consumer segmentation, distribution network parameter estimation, and so on.

FIG. 6 depicts another exemplary PMU dataset 600 of PMU sensor measurements according to one or more examples the present disclosure. Referring to FIG. 6, the PMU dataset 600 shows a plurality of missing entries denoting PMU measurements that were not received by the hierarchical computing system 104. In other words, the hierarchical computing system 104 may receive certain PMU measurements from the PMUs 102 and/or 312, but might not receive other PMU measurements from the PMUs 102 and/or 312. Similar to PMU dataset 500, the columns of the PMU dataset 600 are particular PMU measurements from particular PMUs (e.g., column 602 denotes a first PMU measurement from a first PMU). The rows of the PMU dataset 600 are associated with time stamps for when the PMU measurements were taken. For instance, the row 622 denote the PMU measurements taken by the PMUs at a first time stamp (e.g., 10:00:00 AM).

As shown, column 608 (e.g., the measurements for the second current magnitudes from the first PMU) shows a plurality of missing sequential entries between time stamps 626 through 630. Similarly, columns 604 (e.g., the measurements for the first current magnitudes from the first PMU) and 618 (e.g., the measurements for the second voltage angle from the third PMU) also show a plurality of missing sequential entries. Furthermore, the entire row 628 shows missing entries. For instance, due to a network connectivity issue or another issue, the hierarchical computing system 104 was unable to receive any PMU measurements at the time stamp associated with row 628. As will be described below, the process 400 may use entries immediately prior to and/or immediately subsequent to the missing entries (e.g., the PMU measurement from column 608 and row 624 and the PMU measurement from column 608 and row 632) to determine the values for the missing sequential PMU measurements (e.g., the missing PMU measurements from time stamps 626 to 630). Similar to PMU dataset 500, it will be appreciated that the exemplary PMU dataset 600 depicted in FIG. 6 is merely an example.

Referring back to FIG. 4, at block 406, the hierarchical computing system 104 determines one or more missing entries within the PMU dataset. Each of the one or more missing entries indicates an absence of the hierarchical computing system 104 receiving a PMU measurement (e.g., a sensor reading such as a phase of the current or magnitude of the current) at that particular time. For example, referring to FIG. 6, the PMU dataset 600 includes a plurality of missing entries and some of these entries are sequential. At block 406, the hierarchical computing system 104 may determine (e.g., identify) the missing entries within the PMU dataset 600. Each of these entries is associated with a sensor reading (e.g., a PMU measurement) at a particular time stamp.

At block 408, the hierarchical computing system 104 determines one or more substitute entries for the one or more missing entries using an optimization algorithm, a first set of PMU measurements taken immediately prior to the one or more missing entries, and/or a second set of PMU measurements taken immediately after the one or more missing entries. For example, referring back FIG. 6, the PMU dataset 600 includes missing entries (e.g., column 608 and rows 626-630). The hierarchical computing system 104 may determine substitute entries (e.g., substitute values for the missing entries for column 608 and rows 626-630) based on entries immediately prior to the missing entries (e.g., the second current magnitude values "23.61582" and "23.64067" associated with column 608 and rows 622 and 624) and/or entries immediately subsequent to the missing entries (e.g., the second current magnitude entries associated with column 608 and rows 632 through 640).

In other words, column 608 may be associated with a particular sensor measurement (e.g., PMU measurement) such as a second current magnitude from the first PMU. A PMU may continuously provide the current magnitude to the hierarchical computing system 104 and the hierarchical computing system 104 may populate these measurements in column 608. Unfortunately, at three consecutive time stamps or time intervals (e.g., rows 626 to 630), the hierarchical computing system 104 is unable to receive the current magnitude from the first PMU. As such, the hierarchical computing system 104 may use an optimization algorithm, the entries that were received prior to the missing entries (e.g., the current magnitudes that were measured prior to time stamp 626), and/or the entries that were received after the missing entries (e.g., the current magnitudes that were measured after time stamp 630).

In some instances, the hierarchical computing system 104 may use different PMU measurements for determining the missing entries. For instance, as shown in FIG. 6, there are a plurality of missing entries for a plurality of PMU measurements that are spread across the time stamps 622-640. The hierarchical computing system 104 may determine the missing entries based on using multiple different PMU measurements within the PMU dataset 600. For example, the hierarchical computing system 104 may use all of the entries immediately prior to and/or immediately after all of the missing entries to determine the substitute entries. In other words, the hierarchical computing system 104 may use the entries immediately prior to and/or after the missing entries in column 604 (e.g., the first current magnitude measurements from the first PMU associated with time stamps 622-626 and 638-640), the entries immediately prior to and/or after the missing entries in column 608 (e.g., the second current magnitude measurements from the first PMU), the entries immediately prior to and/or after the missing entries in column 618 (e.g., the second voltage angles from the third PMU), and/or additional entries to determine the values for the substitute entries.

The optimization algorithm that is used to determine the substitute entries may be and/or include one or more minimization/optimization algorithms. For instance, the hierarchical computing system 104 may use an optimization algorithm that determines differences between the entries (e.g., the entries prior to and/or after the missing entries) as well as the differences between the missing entries to determine the substitute entries. For example, the hierarchical computing system 104 may use a total variation (TV) algorithm with a TV variable and/or a TV regularization parameter to determine the substitute entries. In some instances, the hierarchical computing system 104 may generate a column vector by stacking rows of the PMU dataset (e.g., PMU dataset 600). Afterwards, the hierarchical computing system 104 may apply the optimization algorithm to the column vector to determine the substitute entries. In some examples, the hierarchical computing system 104 may use another optimization algorithm such as a Nuclear Norm Minimization or Optimization Algorithm with the TV algorithm to determine the substitute entries.

Equation (1) (Eq. (1)) below will be used to describe one example of the optimization algorithm (e.g., minimization algorithm) in more detail.

$$\text{minimize} \|X\|_* + \lambda \|\text{col}(X^T)\|_{TV}$$

$$\text{subject to } X_{ij} = M_{ij}, (i,j) \in \Omega, \quad \text{Eq. (1)}$$

As shown, X represents a PMU dataset (e.g., PMU dataset 600) with missing entries, $\|X\|_*$ represents a Nuclear Norm Minimization algorithm of the PMU dataset, $\lambda$ represents a TV parameter that is used to scale the TV algorithm, $\text{col}(X^T)$ represents the column stacking vector for the PMU dataset that is transposed, and $\|\text{col}(X^T)\|_{TV}$ represents the TV algorithm. Further, i represents the row and j represents the column of the dataset (e.g., data matrix), $X_{ij}$ represents all of the elements of the data matrix/dataset that are observed and that are missing (e.g., the missing entries), $M_{ij}$ represents the observed values within the data matrix/dataset, and $\Omega$ represents a random subset of cardinality m number of observations. In other words, in the optimization problem provided by Eq. (1), the goal is to recover the data matrix X, which has some of its entries that are observed as $X_{ij} = M_{ij}$, but also some entries that may be missing. Based on these measurements being sufficient (e.g., above a threshold) and in the proper positions, then the computing system 104 may determine a low rank matrix that includes those entries and is a solution of the optimization problem.

In some examples, the TV parameter, $\lambda$, may be large enough such that the values from the TV algorithm are weighted significantly more than the Nuclear Norm Minimization algorithm. In such examples, the hierarchical computing system 104 may just use the TV algorithm for determining the substitute entries (e.g., the Nuclear Norm Minimization algorithm is not used).

The TV algorithm may be a first order or a second order formulation. Equations (2) and (3) below will be used to show and describe the first and second order algorithms.

$$\|x\|TV1 \triangleq \sum_{i=1}^{n-1} |x_{i+1} - x_i| = \sum_{i=1}^{n-1} |\Delta x_i| = \|\Delta x\|_1, \quad \text{Eq. (2)}$$

$$\|x\|TV2 \triangleq \sum_{i=2}^{n-1} |x_{i+1} - 2x_i + x_{i-1}| = \sum_{i=2}^{n-1} |\Delta^2 x_i| = \|\Delta^2 x\|_1 \quad \text{Eq. (3)}$$

Eq. (2) shows a first order formulation of the TV algorithm and Eq. (3) shows a second order formulation of the TV algorithm. For instance, referring to Eq. (2) and Eq. (3), these equations are summation equations (e.g., TV norm definitions) where x is a signal vector (time series) with its i-th entry (i represents a time index) that is given by xi. Eq. (2) shows the subtraction (e.g., a difference) of two adjacent values to capture the first order discrete total variation in the signal. Eq. (3) is similar to Eq. (2), but shows the second order total variation.

In other words, referring to FIG. 6, the hierarchical computing system 104 may use the first or second order formulations to determine the substitute entries that are missing within the PMU dataset 600. For instance, the hierarchical computing system 104 may use a summation of each entry within the PMU dataset 600 with their previous entry. For example, referring to column 602, the hierarchical computing system 104 may use a summation of each entry subtracted by its previous entry such as a summation of the absolute values for 332.015-331.989, 331.986-332.015, X1-331.986, 332.123-X1, 332.447-332.123, and so on. The variable, X1, denotes a missing entry (e.g., the entry at column 602 and row 628) and would be placed as well into the summation equation. The summation would further include the other columns with its missing entries as well. For instance, for column 604, the summation equation would include a summation of the absolute values for 18.10714-17.9606, 18.08795-18.10714, X2-18.08795, X3-X2, X4-X3, X5-X4, X6-X5, 17.98999-X6, and 17.99116-17.98999. X2 through X6 denote the missing entries from column 604 (e.g., entries for the rows 628-636). The hierarchical computing system 104 may continue to formulate the entire summation by going through all of the columns (e.g., the summation of column 602 may be combined with column 604, column 606, and so on). FIG. 7 depicts another exemplary PMU dataset of sensor measurements according to one or more examples of the present disclosure. In particular, FIG. 7 shows the missing entries as unique variables (e.g., X1-X18).

Therefore, after the combination, the hierarchical computing system 104 may determine a single equation that includes a numerical value representing the known entries and a plurality of variables representing the missing entries (e.g., X1-X18). Then, referring back to Eq. (1), this equation may be multiplied by the TV parameter ($\lambda$) and/or combined with the Nuclear Norm Minimization algorithm. Afterwards, the hierarchical computing system 104 may use an optimization algorithm (e.g., a MATLAB minimization algorithm and/or another optimization algorithm) so as to minimize the equation to determine the values of the missing entries (e.g., X1-X18). The hierarchical computing system 104 may use any type of optimization (e.g., convex optimization) algorithm and/or other algorithms to determine the variables X1-X18.

While the first order formulation of the TV algorithm is described above, the hierarchical computing system 104 may use Eq. (3) or a second order formulation of the problem to determine the variables for the missing entries.

In some variations, the hierarchical computing system 104 may use previous PMU datasets to determine whether to use the first and/or second order formulations (e.g., Eq. (2) or Eq. (3)) and/or to determine the TV parameter ($\lambda$). For example, the hierarchical computing system 104 may use a relative recovery error measurement, which is shown in Eq. (4) below, to determine whether to use the first and/or second order formulations and/or to determine the TV parameter ($\lambda$).

$$\text{Relative Recovery Error} = \frac{\|M - X\|_F}{\|M\|_F}, \quad \text{Eq. (4)}$$

As shown, M represents the actual PMU matrix/PMU dataset and X represents the recovered matrix/PMU dataset. In other words, the hierarchical computing system 104 may receive a complete set of PMU measurements from a plurality of PMUs, which may be represented by M. Then, the hierarchical computing system 104 may remove certain selections of PMU measurements from the PMU dataset. Then, the hierarchical computing system 104 may use different values for the TV parameter and/or the first or second order formulations to determine the missing entries. The hierarchical computing system 104 may generate the matrix X by inserting the missing entries into the selections of PMU measurements that have been removed from the PMU dataset. After, the hierarchical computing system 104 may use Eq. (4) to determine the relative recovery error. The hierarchical computing system 104 may continuously apply different TV parameters/first or second order formulation to determine the best relative recovery error. Subsequently, the hierarchical computing system 104 may use the determined optimal TV parameter/first or second order formulation in process 400 above to determine the missing entries.

To put it another way, each power grid or power system may be different. For instance, certain power systems may have more PMUs or PMUs that are spread out across a greater distance. Further, the environmental factors for the power system may be different (e.g., a power grid in a northern state may be different from a power grid from a southern state). Accordingly, the hierarchical computing system 104 may use a TV parameter and/or a first/second order formulation to account for the differences between different power grids/systems. For instance, the hierarchical computing system 104 may obtain a PMU dataset and use the PMU dataset to determine the optimal TV parameter to use for determining the missing entries. The hierarchical computing system 104 may then use the TV parameter to determine the missing entries. As mentioned previously, in some examples, the TV parameter may be significantly large enough such that the hierarchical computing system 104 may only use the TV algorithm to determine the missing entries.

At block 410, the hierarchical computing system 104 inserts the one or more substitute entries into the PMU dataset to generate a new PMU dataset. For instance, referring to FIG. 7, after determining the variables X1-X18 at block 408, the hierarchical computing system 104 may insert these variables into the PMU dataset.

At block 412, the hierarchical computing system 104 executes an action based on the new PMU dataset. For example, the hierarchical computing system 104 may include a display device and may display the new PMU dataset on the display device. Additionally, and/or alternatively, the hierarchical computing system 104 may calculate a state estimation for the power system/power grid (e.g., the power system 300) using the new PMU dataset and provide the state estimation to the power generation system (e.g., power generation system 302). Additionally, and/or alternatively, the hierarchical computing system 104 may provide the new PMU dataset to the power generation system and the power generation system may determine the state estimation. Additionally, and/or alternatively, the computing system 104 may execute an action such as performing anomaly detection, performing data analytics, cleaning up the data, false data injection, consumer segmentation, distribution network parameter estimation, and/or additional actions.

In other words, the present disclosure describes the analysis of large amount of power system synchrophasor data efficiently at the edge including data compression and missing data recovery. The electric power industry is going through the greatest paradigm shift since the discovery of electricity itself in the late 1800s. The massive modernization of the industry is fueled by state of the art information technologies, an exponential increase in computational power, and power system monitoring advancements, such as synchrophasor technologies. A principal component of the smart grid initiative is the utilization of massive data sets to make future grids more efficient, reliable and environmentally friendly with minimal financial burden to the utilities and their stakeholders.

Electrical systems are very interconnected systems via tie lines and control areas. Thus, a disturbance in one utility can propagate to other interconnected systems. A Wide Area Monitoring (WAM) of a power system is necessary to help ensure that a disturbance in a utility does not disrupt the operation of another. A WAM system is one of the key requirements for future smart grids. Global positioning system (GPS) synchronized synchrophasor data at a high speed has made the vision of WAM attainable. PMUs can sense parameters such as voltage, current, frequency etc. of a power system typically at 30 samples per second compared to one sample per 2-4 seconds in Supervisory Control and Data Acquisition (SCADA) system.

Most of these PMUs have multiple channels. At a phasor data transmission rate of 30, 50, or 60 sampling rates per second or other sampling rates, collectively, the PMU data accumulation is in the range of several terabits per day. A present system may handle 120 online PMUs with 3.6 billion measurements archived per day with a storage size of 36 gigabits (GB). The amount of data is set to increase exponentially as more PMUs are brought online. The explosion of time synchronized data has brought a tremendous opportunity for researchers to view the electric grid in a never seen before perspective. It has also brought a challenge to transmit, store, analyze and retrieve massive data efficiently. In addition to a continuous data stream from a PMU, synchrophasor data also tends to have a large dimensionality.

The present disclosure describes a system and method that is computationally efficient and may recover the ground-truth data even if simultaneous and consecutive data losses and errors happen across all PMU channels.

The large amount of synchrophasor data obtained by Phasor Measurement Units (PMU) provides dynamic visibility into power systems. Extracting reliable information from the data can enhance power system situational awareness. The data quality often suffers from data losses, bad data, and cyber data attacks.

The present disclosure describes an effective and efficient recovery of data at a hierarchical computing system 104 given phasor measurement unit data that is partially missing either randomized or temporally. In particular, the present disclosure describes the framework to solve the problem of:

1. An efficient method to compress the massive data generated by PMU at the edge without losing too much information; and 2. An efficient method to retrieve PMU randomized and/or temporally missing data due to communication congestion, sensor malfunction, and bad data at the edge using simultaneously inherent property of PMU data such as low-rank and slowly varying data.

Among other advantages, the present disclosure develops an efficient and low complex algorithm that can recover randomized and/or temporally missing data at the edge.

Since many practical PMU datasets have intrinsic low-dimensional structures, the missing data recovery problem may be formulated as a low-rank matrix completion problem. Given an n×n matrix with rank r (r<<n), as long as order of its degrees of freedom entries are observed, all the remaining entries can be accurately recovered by solving a convex nuclear norm minimization. The low-rank matrix model, however, does not capture the temporal correlations in time series therefore, it is not suitable for temporally missing data recovery problem. In signal processing and system identification, the matrices under consideration are often structured (the matrix structures are mostly Hankel/Toeplitz or alike), therefore the general results on the performance of the nuclear norm cannot be applied. As a result, the Hankel norm minimization problem can effectively recover both randomized and temporally missing data at the price of increasing computational cost.

There are many applications where the model of interest is known to have several structures at the same time. A signal may be sought that lies in the intersection of several sets defining the individual structures. An example of a simultaneously structured model is a matrix that is simultaneously low-rank and slowly varying. For instance, the signal of interest is low-rank and its entries may vary slowly, i.e., the signal can be approximated by a piecewise constant function. To encourage low-rank, the nuclear norm may be used that is a convex relaxation of rank minimization problem. To promote the piecewise constant structure, a first or second order discrete total variation (TV) is described that can be used by adding as a regularization term into original nuclear norm minimization problem. This technique may efficiently recover both randomized and temporally missing data without having the complexity of Hankel norm minimization problem that makes this algorithm suitable to run at the edge. The comparison between the algorithm described in the present disclosure and existing ones is given in the following table.

TABLE 1

| Matrix completion algorithms | | | |
|---|---|---|---|
| Algorithm | Randomized missing data recovery | Temporally missing data recovery | Algorithm simplicity |
| Nuclear norm minimization | Yes | No | Yes |
| Hankel norm minimization | Yes | Yes | No |
| Nuclear norm with total variation minimization | Yes | Yes | Yes |

Figure 8:
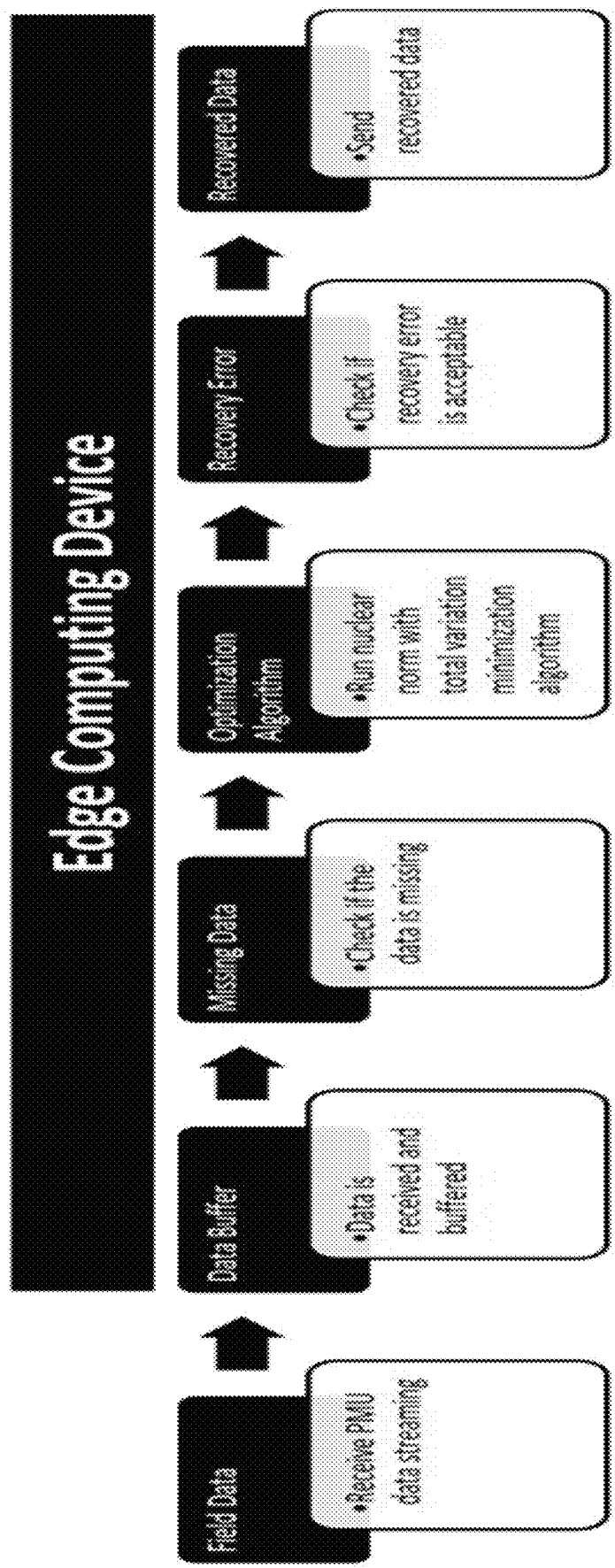
FIG. 8 illustrates another simplified block diagram depicting a data recovery architecture according to one or more examples of the present disclosure.

FIG. 8 illustrates another simplified block diagram depicting a data recovery architecture according to one or more examples of the present disclosure. In particular, FIG. 8 describes PMU data recovery within a power system. The first stage (e.g., Field Data and Data Buffer) includes a communications radio to poll and receive smart meter streaming data as well as a local buffer at the edge device to store smart meter streaming data. The size of the buffer may be larger than the size of the batch of data that is usually a week or month of data. Since the size of the buffer is fixed, the old data will be overwritten by the new one. This data may be received by directly communicating with advanced metering infrastructure (AMI) meters (e.g. through a sub-900 mega hertz (MHz) radio), inferred measurements from another smart device such as a smart recloser or transformer, or direct integration of the smart meter with an edge or cloud storage platform using secondary protocols such as Advanced Message Queuing Protocol (AMQP), Message Queuing Telemetry Transport (MQTT), or Data Distribution Service (DDS). In the second stage (e.g., Missing Data), a batch of data from the buffer is read and check for missing data. If missing data is found, then optimization algorithm is called for data recovery and the recovery error is calculated (e.g., Optimization Algorithm and Recovery Error). If the recovery error is acceptable, the recovered data may be provided to a third party.

In other words, an efficient and low complex algorithm that may be used to recover randomized and/or temporally missing data at the edge is described. In some instances, PMU matrix data (e.g., the PMU dataset) is not only low-rank, but its entries vary slowly therefore, the signals may be approximated by a piecewise constant function (each row of PMU matrix data is related to measure a physical property at different time stamps). To promote this, the TV variable/algorithm may be used with or without the Nuclear Norm algorithm. Two discrete TV terms (e.g., first and second order) are described herein. In the first order, the variation may be calculated based on the difference between two consecutive values (such as forward or backward difference in approximating derivative at some point). In the second order, a centered difference technique to approximate the gradient of the signal based on three consecutive values of data may be used.

In some instances, the order of complexity of recovering a low-rank matrix is equal to its degrees of freedom. Therefore, solving the Hankel nuclear norm minimization problem takes much more time than nuclear norm minimization problem due to the difference in their degrees of freedom, but using nuclear norm alone is incapable of determining all of the missing entries. Accordingly, the present disclosure presents an efficient and cost-effective solution for determining the missing entries/data from PMUs.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. For example, the various embodiments of the kinematic, control, electrical, mounting, and user interface subsystems can be used interchangeably without departing from the scope of the invention. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for recovering missing phase measurement unit (PMU) measurements from a plurality of PMUs that are spread across an electrical power system, comprising:
   receiving a plurality of obtained PMU measurements from the plurality of PMUs, wherein each of the plurality of obtained PMU measurements is associated with a time stamp and a sensor reading corresponding to an electrical characteristic;
   populating a PMU dataset based on the plurality of obtained PMU measurements;
   determining a plurality of missing entries within the PMU dataset, wherein each of the plurality of missing entries indicates a missing PMU measurement within the PMU dataset at a particular time;
   determining a plurality of substitute entries for the plurality of missing entries based on an optimization algorithm that determines differences associated with a missing entry, of the plurality of missing entries, and at least a first set of PMU measurements, of the plurality of obtained PMU measurements, that are taken immediately prior to the missing entry;
   inserting the plurality of substitute entries into the PMU dataset to generate a new PMU dataset;
   calculating a current state for the electrical power system using the new PMU dataset; and
   providing the current state to a power generation system of the electrical power system, wherein the power generation system increases or decreases power provided by the electrical power system based on the current state,
   wherein the PMU dataset is a matrix indicating the plurality of obtained PMU measurements and the plurality of missing entries, and wherein determining the plurality of substitute entries comprises:
      using a column stacking vector and a total variation (TV) algorithm to determine a TV norm definition associated with the plurality of obtained PMU measurements and the plurality of missing entries.

2. The method of claim 1, wherein each of the plurality of PMUs is located at a different location within the electrical power system and configured to obtain a plurality of sensor readings corresponding to a plurality of electrical characteristics at the different location, and
   wherein the plurality of electrical characteristics comprise a magnitude of a current, a phase angle of the current, a magnitude of a voltage, and a phase angle of the voltage.

3. The method of claim 2, further comprising:
   determining the first set of PMU measurements based on the electrical characteristic, of the plurality of electrical characteristics, associated with a first missing entry, wherein the first set of PMU measurements are PMU measurements that are taken by a first PMU, of the plurality of PMUs, immediately prior in time to the first missing entry.

4. The method of claim 3, wherein the plurality of missing entries comprises a plurality of sequentially missing entries for the electrical characteristic, wherein the plurality of sequentially missing entries comprises the first missing entry within the plurality of sequentially missing entries and a last missing entry within the plurality of sequentially missing entries, and wherein the method further comprises:
   determining a second set of PMU measurements, of the plurality of obtained PMU measurements, that are taken immediately after the last missing entry, and
   wherein determining the plurality of substitute entries is further based on the second set of PMU measurements.

5. The method of claim 3, wherein the plurality of missing entries further comprises a second missing entry associated with a second electrical characteristic, of the plurality of electrical characteristics, that is different from the electrical characteristic associated with the first missing entry, and wherein the method further comprises:
   determining a third set of PMU measurements based on the second electrical characteristic, wherein the third set of PMU measurements are PMU measurements that are taken by a second PMU, of the plurality of PMUs, immediately prior in time to the second missing entry, and
   wherein determining the plurality of substitute entries is further based on the third set of PMU measurements.

6. The method of claim 1, wherein the TV algorithm is a first order equation that is a summation of differences between each entry within the PMU dataset with a previous entry within the PMU dataset.

7. The method of claim 1, wherein the TV algorithm is a second order equation.

8. The method of claim 1, wherein determining the plurality of substitute entries further comprises using a nuclear norm minimization algorithm and a TV parameter that is a weighted value for the TV algorithm to distinguish the TV algorithm from the nuclear norm minimization algorithm.

9. The method of claim 8, further comprising:
   using a plurality of historical PMU measurements from the plurality of PMUs within the electrical power system to determine a plurality of TV parameters; and
   determining the TV parameter from the plurality of TV parameters based on a relative recovery error associated with the plurality of historical PMU measurements.

10. The method of claim 1, wherein the plurality of missing entries indicates temporally missing data and randomized missing data, and
   wherein determining the plurality of substitute entries comprises using the optimization algorithm to determine the plurality of substitute entries for the temporally missing data and the randomized missing data.

11. A system for recovering missing phase measurement unit (PMU) measurements, comprising:
   a plurality of PMUs configured to obtain a plurality of PMU measurements;
   a hierarchical computing system comprising:
      one or more first computing systems configured to:
         receive the plurality of obtained PMU measurements from the plurality of PMUs, wherein each of the plurality of obtained PMU measurements is associated with a time stamp and a sensor reading corresponding to an electrical characteristic; and
         provide the plurality of obtained PMU measurements to one or more second computing systems; and
      the one or more second computing systems configured to:
         populate a PMU dataset based on the plurality of obtained PMU measurements;
         determine a plurality of missing entries within the PMU dataset, wherein each of the plurality of missing entries indicates a missing PMU measurement within the PMU dataset at a particular time;
         determine a plurality of substitute entries for the plurality of missing entries based on an optimization algorithm that determines differences associated with a missing entry, of the plurality of missing entries, and a first set of PMU measurements, of the plurality of obtained PMU measurements, that are taken immediately prior to the missing entry;
         insert the plurality of substitute entries into the PMU dataset to generate a new PMU dataset;
         calculate a current state for an electrical power system using the new PMU dataset; and
         provide the current state to a power generation system of the electric power system, wherein the power generation system increases or decreases power provided by the electrical power system based on the current state,
         wherein the PMU dataset is a matrix indicating the plurality of obtained PMU measurements and the plurality of missing entries, and wherein the one or more second computing systems are configured to determine the plurality of substitute entries by using a column stacking vector and a total variation (TV) algorithm to determine a TV norm definition associated with the plurality of obtained PMU measurements and the plurality of missing entries.

12. The system of claim 11, wherein each of the plurality of PMUs is located at a different location within a power system, and wherein the plurality of PMUs are configured to obtain the plurality of PMU measurements by obtaining a plurality of sensor readings corresponding to a plurality of electrical characteristics at the different location, and wherein the plurality of electrical characteristics comprise a magnitude of a current, a phase angle of the current, a magnitude of a voltage, and a phase angle of the voltage.

13. The system of claim 12, wherein the one or more second computing systems are further configured to:
   determine the first set of PMU measurements based on the electrical characteristic, of the plurality of electrical characteristics, associated with a first missing entry, wherein the first set of PMU measurements are PMU measurements that are taken by a first PMU, of the plurality of PMUs, immediately prior in time to the first missing entry.

14. The system of claim 13, wherein the plurality of missing entries comprises a plurality of sequentially missing entries for the electrical characteristic, wherein the plurality of sequentially missing entries comprises the first missing entry within the plurality of sequentially missing entries and a last missing entry within the plurality of sequentially missing entries, and
   wherein the one or more second computing systems are further configured to:
      determine a second set of PMU measurements, of the plurality of obtained PMU measurements, that are taken immediately after the last missing entry, and
      wherein determining the plurality of substitute entries is further based on the second set of PMU measurements.

15. The system of claim 13, wherein the plurality of missing entries further comprises a second missing entry associated with a second electrical characteristic, of the plurality of electrical characteristics, that is different from the electrical characteristic associated with the first missing entry, and
   wherein the one or more second computing systems are further configured to:
      determine a third set of PMU measurements based on the second electrical characteristic, wherein the third set of PMU measurements are PMU measurements that are taken by a second PMU, of the plurality of PMUs, immediately prior in time to the second missing entry, and wherein determining the plurality of substitute entries is further based on the third set of PMU measurements.

16. The system of claim 11, wherein the TV algorithm is a first order equation that is a summation of differences between each entry within the PMU dataset with a previous entry within the PMU dataset.

17. The system of claim 11, wherein determining the plurality of substitute entries further comprises using a nuclear norm minimization algorithm and a TV parameter that is a weighted value for the TV algorithm to distinguish the TV algorithm from the nuclear norm minimization algorithm.

18. A non-transitory computer-readable medium having processor-executable instructions stored thereon, wherein the processor-executable instructions, when executed by one or more controllers, facilitate:

receiving a plurality of obtained PMU measurements from a plurality of PMUs, wherein each of the plurality of obtained PMU measurements is associated with a time stamp and a sensor reading corresponding to an electrical characteristic;

populating a PMU dataset based on the plurality of obtained PMU measurements;

determining a plurality of missing entries within the PMU dataset, wherein each of the plurality of missing entries indicates a missing PMU measurement within the PMU dataset at a particular time;

determining a plurality of substitute entries for the plurality of missing entries based on an optimization algorithm that determines differences associated with a missing entry, of the plurality of missing entries, and a first set of PMU measurements, of the plurality of obtained PMU measurements, that are taken immediately prior to the missing entry;

inserting the plurality of substitute entries into the PMU dataset to generate a new PMU dataset;

calculating a current state for an electrical power system using the new PMU dataset; and providing the current state to a power generation system of the electrical power system, wherein the power generation system increases or decreases power provided by the electrical power system based on the current state, wherein the PMU dataset is a matrix indicating the plurality of obtained PMU measurements and the plurality of missing entries, and wherein determining the plurality of substitute entries comprises:

using a column stacking vector and a total variation (TV) algorithm to determine a TV norm definition associated with the plurality of obtained PMU measurements and the plurality of missing entries.

* * * * *